(12) United States Patent  
Allen et al.

(10) Patent No.: US 7,672,185 B2  
(45) Date of Patent: Mar. 2, 2010

(54) METHOD AND APPARATUS TO MONITOR CIRCUIT VARIATION EFFECTS ON ELECTRICALLY PROGRAMMABLE FUSES

(75) Inventors: David H. Allen, Rochester, MN (US); Phil C. F. Paone, Rochester, MN (US); Gregory J. Uhlmann, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 454 days.

(21) Appl. No.: 11/619,287

(22) Filed: Jan. 3, 2007

(65) Prior Publication Data

US 2008/0158933 A1    Jul. 3, 2008

(51) Int. Cl.
    *G11C 17/18* (2006.01)
(52) U.S. Cl. .................. 365/225.7; 365/96; 365/201
(58) Field of Classification Search .............. 365/96, 365/225.7, 200, 201
See application file for complete search history.

(56) References Cited

U.S. PATENT DOCUMENTS

| 6,368,902 | B1 * | 4/2002 | Kothandaraman et al. ... | 438/132 |
|---|---|---|---|---|
| 6,624,499 | B2 * | 9/2003 | Kothandaraman et al. ... | 257/529 |
| 6,934,176 | B2 * | 8/2005 | Low et al. ................... | 365/96 |
| 7,224,633 | B1 * | 5/2007 | Hovis et al. ................ | 365/225.7 |
| 7,489,572 | B2 * | 2/2009 | Aipperspach et al. ....... | 365/201 |
| 7,528,646 | B2 * | 5/2009 | Aipperspach et al. ....... | 327/525 |
| 7,533,240 | B1 * | 5/2009 | Urabe et al. ................ | 711/202 |
| 2008/0180983 | A1 * | 7/2008 | Vollrath ...................... | 365/96 |
| 2008/0197915 | A1 * | 8/2008 | Minzoni et al. ............. | 327/544 |

* cited by examiner

*Primary Examiner*—Tuan T Nguyen
*Assistant Examiner*—Hien N Nguyen
(74) *Attorney, Agent, or Firm*—Matthew C. Zehrer

(57) ABSTRACT

A monitor bank consists of test one time programmable memory that is programmed distinctively from functional one time programmable memory in order to determine whether the functional one time programmable memory has or will program successfully. In a specific embodiment, each monitor bank consists of a first eFuse configured to expectedly never blow, a second eFuse configured to expectedly always blow, and at least a third eFuse configured to be more difficult to blow than the first eFuse, but easier to blow than the second eFuse. The method of determining whether functional eFuses have or will be programmed successfully is described: programming a monitor bank; sensing whether the test eFuses have blown; creating a monitor bank bit line blow pattern; determining an anticipated bit line blow pattern; comparing the two patterns; and determining that the functional eFuses will not blow successfully if the patterns do not match.

20 Claims, 11 Drawing Sheets

| | 810 | 811 | 812 | 813 | 814 | 815 | 816 | 817 | 818 | 819 | |
|---|---|---|---|---|---|---|---|---|---|---|---|
| $621_{e-1}$ | 0 | 0 | 0 | 0 | 1 | 1 | 1 | 1 | 1 | 1 | |
| $621_{e}$ | 0 | 0 | 0 | 0 | 0 | 1 | 1 | 1 | 1 | 1 | |
| $621_{e+1}$ | 0 | 0 | 0 | 0 | 0 | 0 | 1 | 1 | 1 | 1 | |

Expected Blow Patterns

FIG. 9B

| 810 | 811 | 812 | 813 | 814 | 815 | 816 | 817 | 818 | 819 | |
|---|---|---|---|---|---|---|---|---|---|---|
| 0 | 0 | 0 | 0 | 1 | 1 | 1 | 1 | 1 | 1 | $621_s$ |
| 0 | 0 | 0 | 0 | 0 | 1 | 1 | 1 | 1 | 1 | $621_t$ |
| 0 | 0 | 0 | 0 | 0 | 0 | 1 | 1 | 1 | 1 | $621_u$ |
| 0 | 0 | 0 | 1 | 1 | 1 | 1 | 1 | 1 | 1 | $621_v$ |
| 0 | 0 | 0 | 0 | 0 | 0 | 0 | 0 | 1 | 1 | $621_w$ |
| 0 | 0 | 0 | 0 | 0 | 0 | 1 | 1 | 0 | 1 | $621_x$ |
| 0 | 0 | 0 | 1 | 0 | 0 | 1 | 1 | 1 | 1 | $621_y$ |
| 0 | 0 | 0 | 0 | 1 | 1 | 0 | 1 | 1 | 1 | $621_z$ |

Actual Blow Patterns

FIG. 9C

METHOD AND APPARATUS TO MONITOR CIRCUIT VARIATION EFFECTS ON ELECTRICALLY PROGRAMMABLE FUSES

BACKGROUND OF THE INVENTION

1. Field of the Invention

This invention relates generally to one time programmable memories (eFuses (electrically programmable fuses), EPROM (Erasable Programmable Read-Only Memory) circuits, etc.). More specifically, this invention relates to an one time programmable memory monitor bank consisting of a plurality of test one time programmable circuits, each circuit having varying parameters, selected from a plurality of possible parameters, and utilized to evaluate whether functional one time programmable memory have or will program (i.e. blow) successfully.

2. Description of the Related Art

Electronic systems increasingly require function to be enabled, disabled, or modified after semiconductor chips used in the electronic systems have been manufactured or have been placed into commerce. For example, a common chip may be designed to serve multiple applications, the chip originally having circuitry to support all of the multiple applications. After manufacture of the chip, eFuses can be blown to personalize the chip for a particular specific application. For a second example, sometimes chips are manufactured imperfectly and portions of the chip are unusable. A computer processor chip may be designed to have a 128 KB (kilobyte) cache, but testing may determine that only 64 KB of the 128 KB is functional. If the remainder of the chip is functional, the chip may still be used, but information must be stored on the chip so that no attempt to use the nonfunctional 64 KB portion of the 128 KB cache is performed.

In modern semiconductor chips eFuses are often used to store such information. An eFuse is electronically programmable, and may be programmed by blowing the eFuse after a chip is manufactured. In many applications, the eFuse is blown even after an electronic system utilizing the chip has been in operation for some time.

An eFuse comprises a silicided polysilicon conductor. Silicide has been widely used in semiconductor products to reduce resistance of a polysilicon conductor, for example polysilicon gates used in Field Effect Transistors (FETs), or a doped silicon region, such as a source or drain of a FET. An eFuse is blown by directing a current of sufficient magnitude and duration through the eFuse to remove by melting or electromigration at least a portion of the silicide between a first end and a second end of the eFuse. Removal of at least a portion of the silicide changes an electrical resistance between the first end and the second end of the eFuse. However other mechanisms may also be used to blow an eFuse. Descriptions of eFuses can be found in U.S. Pat. No. 6,368,902, "Enhanced eFuses by the local degradation of the fuse link", by Chandrasekharan Kothandaraman, et al, and U.S. Pat. No. 6,624,499, "System for programming fuse structure by electromigration of silicide enhanced by creating temperature gradient", by Chandrasekharan Kothandaraman, et al.

Normal process and/or manufacturing variations in device components utilized in eFuse circuits may increase the difficulty to sense that an eFuse has been successfully blown. For example these variations may be, but not limited to: transistor channel length (i.e. fluctuations in the distance between the source and drain of a transistor gives rise to variations in drain current) gate width (i.e. fluctuations in the gate width of a transistor gives rise to variations in drain current) and threshold voltage. Some of the causes of threshold voltage variation are: worsening short channel effect, variations in gate oxide thickness, variations in FET currents due to temperature gradients, etc.

Along with the processing and/or manufacturing variations, the ability to blow and sense eFuses also varies with environmental conditions. For example these variations may be, but not limited to: temperature, biasing, voltage, noise, etc.

Wear out mechanisms common in silicon devices can also add variability to device characteristics over time, making the ability to blow and sense eFuses difficult. For example these variations may be, but not limited to: hot electron degradation and negative bias temperature instability (NBTI). These variations have, in previous electronic systems having eFuses, resulted in eFuses failing to blow, causing logic and other design faults.

eFuses are subjected to natural or environmental component degradations, tolerances, or errors that cause the ability to blow and sense eFuses difficult. It is also increasingly common for electrical systems to utilize eFuses that are to be programmed after the device has left control of the manufacturer. Therefore, there is a need for a method and apparatus that determines whether eFuse programming will be or has been successful.

SUMMARY OF THE INVENTION

A first aspect of the invention includes a monitor bank that consists of test one time programmable memories that are programmed distinctively from functional one time programmable memories in order to determine whether the functional one time programmable memories has or will program successfully.

An exemplary embodiment of the first aspect of the invention includes a monitor bank consisting of test eFuse circuits representing functional eFuse circuits (i.e. the monitor bank of test eFuses portrays, depicts, and presents the likeness of the functional eFuse circuits). The test eFuse circuits are programmed distinctively (i.e. at separate time instances) from the functional eFuse circuits. The monitor bank of test eFuse circuits is utilized to determine whether the functional eFuse circuits have been or will be reliably programmed. Within each monitor bank there may be a first eFuse circuit configured to never blow when the monitor bank is programmed, a second eFuse circuit configured to always blow when the monitor bank is programmed, and a third eFuse circuit configured to be more difficult to blow than the first eFuse circuit, but easier to blow than the second eFuse circuit.

Another aspect of the invention includes the method of determining whether the functional eFuses have been or will be successfully programmed. This method consists of the following steps: programming a monitor bank of test eFuses, the monitor bank being located on the semiconductor chip or the semiconductor wafer, each test eFuse having a test eFuse link, and a differing configuration wherein the amount of current passing through each test eFuse link differs; sensing whether the test eFuses in the monitor bank have blown; arranging the output monitor bank programming data in a bit line pattern; determining at least one acceptable output bit line pattern; comparing the output monitor bank programming bit line pattern with the at least one acceptable output bit line pattern; and either rejecting or accepting the semiconductor chip or semiconductor wafer if the bit line patterns do or do not match respectively.

Though the invention is described using the technology of an eFuse as an example of a one time programmable memory, one skilled in the art will recognize that the invention may be applied to other various types of one time programmable memory such as but not limited to electrically EPROM, Flash erase EPROM, etc.

In yet another aspect of the invention a monitor bank with a plurality of test eFuses having varying circuit parameters is configured to isolate a first particular eFuse degradation characteristic. Similarly a plurality of other monitor banks utilize a plurality of test eFuses with varying circuit parameters configured to each isolate a plurality of other various particular eFuse degradation characteristics. An eFuse degradation characteristic may be isolated by designing the test eFuse circuit by selecting circuit parameter(s) so that the particular characteristic will have an larger than nominal affect on the circuit parameter(s). Upon programming, the bit line blow pattern of each of the plurality of monitor banks is compared to an expected bit line blow pattern. If the actual bit line blow pattern of a particular monitor bank matches a predetermined expected acceptable bit line blow pattern the eFuse degradation characteristic isolated by the particular monitor bank has potentially not affected the success of eFuse programming. If the actual bit line blow pattern of a particular monitor bank does not match a predetermined expected acceptable bit line blow pattern the eFuse degradation characteristic isolated by the particular monitor bank has potentially affected the success of eFuse programming. Therefore the parameters in the functional eFuses contained within an electrical system may be adapted to compensate for the eFuse degradation that has been identified.

BRIEF DESCRIPTION OF THE DRAWINGS

FIG. 9B depicts an example of expected bit line blow patterns for a programmed monitor bank of ten test eFuse circuits.

FIG. 9C depicts an examples of actual bit line blow patterns.

DETAILED DESCRIPTION OF THE PREFERRED EMBODIMENTS

Figure 1:
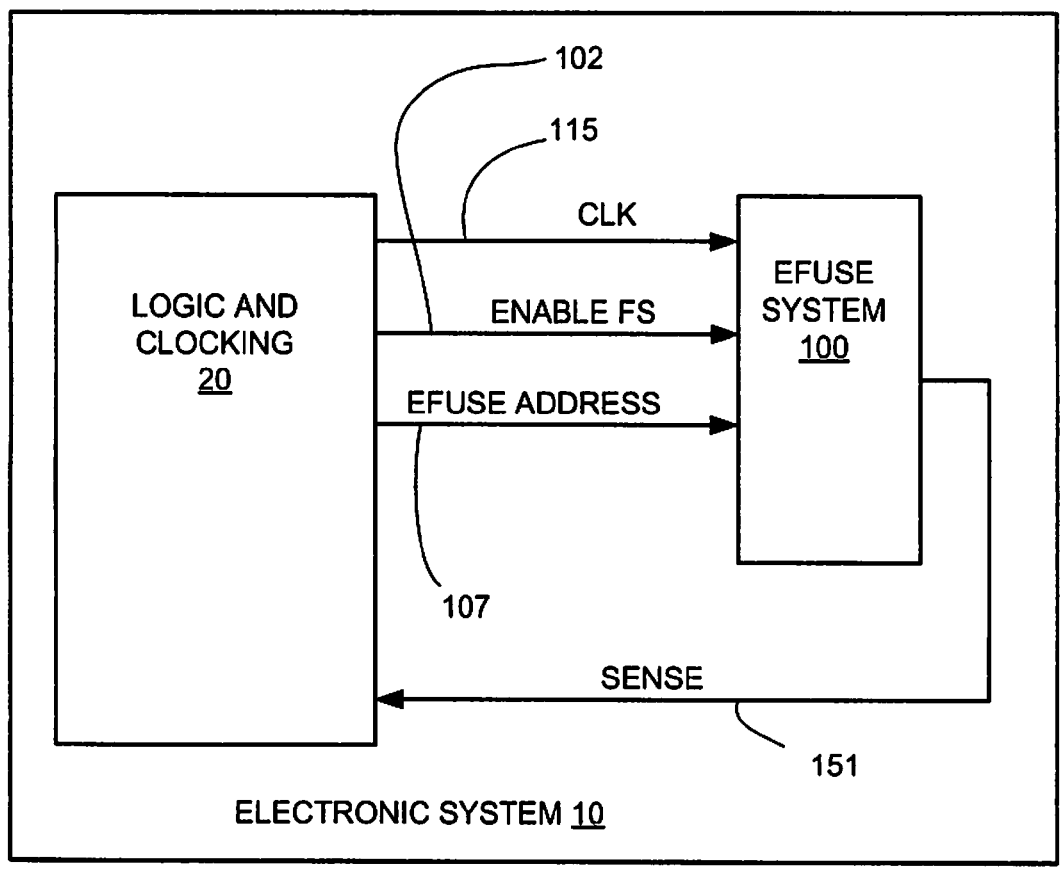
FIG. 1 depicts a prior art electronic system utilizing an eFuse system.

In the following detailed description of the preferred embodiments, reference is made to the accompanying drawings, which form a part hereof, and within which are shown by way of illustration specific embodiments by which the invention may be practiced. It is to be understood that other embodiments may be utilized and structural changes may be made without departing from the scope of the invention.

The present invention provides a method and apparatus to determine if functional eFuse will blow successfully. An eFuse is blown successfully if the eFuse has blown as anticipated, or alternatively if the eFuse has blown adequately enough for the eFuse sense circuitry to reliably sense that the eFuse has blown.

Embodiments of the present invention provide techniques and systems whereby operation of and/or access to particular features of an electronic device may be controlled after the device has left the control of the manufacturer. The device may include a set of non-volatile storage elements, such as electronically programmable fuses (hereinafter eFuses) or other one time programmable memories (i.e. EPROM), that may be programmed to control the operation of or access to these features. According to some embodiments, a purposeful set of reconfiguration characteristics may be initiated by the manufacturer in order to enable chip functionality and/or minimize data bottlenecks. For some embodiments, power and performance device characteristics for each device may be determined during manufacturing testing and each device may be subsequently configured accordingly for specific applications.

In the following, reference is made to embodiments of the invention. However, it should be understood that the invention is not limited to specific described embodiments. Instead, any combination of the following features and elements, whether related to different embodiments or not, is contemplated to implement and practice the invention. Furthermore, in various embodiments the invention provides numerous advantages over the prior art. However, although embodiments of the invention may achieve advantages over other possible solutions and/or over the prior art, whether or not a particular advantage is achieved by a given embodiment is not limiting of the invention. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Polysilicon, the material, has a relatively wide resistance tolerance. Silicided polysilicon, while having a lower resistance than Polysilicon, also has a resistance tolerance. Furthermore, there is a significant range in exactly how much silicide is removed from polysilicon on an eFuse when the eFuse is blown. Variations such as, but not limited to these, effect the ability to sense and blow eFuses.

Normal process and/or manufacturing variations in device components utilized in eFuse circuits may increase the difficulty to sense that an eFuse has been successfully blown. For example these variations may be, but not limited to: transistor channel length (i.e. fluctuations in the distance between the source and drain of a transistor gives rise to variations in drain current) gate width (i.e. fluctuations in the gate width of a transistor gives rise to variations in drain current) and threshold voltage. Some of the causes of threshold voltage variation are: worsening short channel effect, variations in gate oxide thickness, variations in FET currents due to temperature gradients, etc.

Along with the processing and/or manufacturing variations, the ability to blow and sense eFuses also varies with environmental conditions. For example these variations may be, but not limited to: temperature, biasing, voltage, noise, etc.

Wear out mechanisms common in silicon devices can also add variability to device characteristics over time, making the ability to blow and sense eFuses difficult. For example these variations may be, but not limited to: hot electron degradation and negative bias temperature instability (NBTI). These variations have, in previous electronic systems having eFuses, resulted in eFuses failing to blow, causing logic and other design faults.

eFuses generally operate in the following manner. A reference cell comprises a first circuitry configured to produce, when the first circuitry is connected to suitable voltage supplies, a reference current that passes through a reference resistance including a series connected unblown eFuse (not necessary in some embodiments) and resistor. The reference resistance is less than a resistance value of a blown eFuse on the same chip. The reference resistance is greater than a resistance of an unblown eFuse on the same chip. The reference cell produces a reference voltage determined by the reference current passing through the reference resistance.

The reference voltage is coupled to an eFuse cell, and is used in the eFuse cell by a second circuitry configured, when the second circuitry is connected to the suitable voltage supplies, to create a mirror of the reference current in the eFuse cell. The mirrored reference current is passed through an eFuse in the eFuse cell, producing an eFuse cell voltage output. The reference voltage is greater than an eFuse cell voltage output if the eFuse in the eFuse cell is unblown. The reference voltage is less than an eFuse cell voltage output if the eFuse in the eFuse cell is blown.

The eFuse cell voltage is compared with the reference voltage by a comparator, the comparator is operable when supplied by a suitable comparator supply voltage. An output of the comparator is a logical value responsive to whether an eFuse cell voltage output is greater than or less than the reference voltage.

Referring now to FIG. 1, an exemplary prior art electronic system 10 is shown. Electronic system 10 can be, for example intended to explain but not limit, a computer processor, an ASIC (application specific integrated circuit) chip, a PDA (personal digital assistant), or an electronic game system. Electronic system 10 comprises logic and clocking 20. Logic and clocking 20, in various electronic system 10 implementations further includes (not shown) an ALU (arithmetic and logic unit), registers, SRAMs (static random access memory), DRAMs (dynamic random access memory), timers, control logic, and the like. Logic and clocking 20 further includes clocking circuitry that, in embodiments, includes phase locked loops, delay locked loops, and oscillators. As stated above, many electronic systems 10 require eFuses to provide nonvolatile personalization after chip manufacture. eFuse system 100 provides such nonvolatile personalization by providing eFuses that can be blown under control of logic and clocking 20. Logic and clocking 20 provides an eFuse address 107 to eFuse system 100 which is used to address an eFuse that is to be blown. Logic and clocking 20 provides an ENABLE FS 102 signal that is used to place eFuse system 100 into a mode where eFuses can be blown. Logic and clocking 20 also sends a clock 115 to eFuse system 100. Clock 115 is used during programming (blowing) of eFuses in eFuse system 100. eFuse system 100 sends information regarding whether one or more eFuses are blown back to logic and clocking 20 on SENSE 151.

Figure 2:
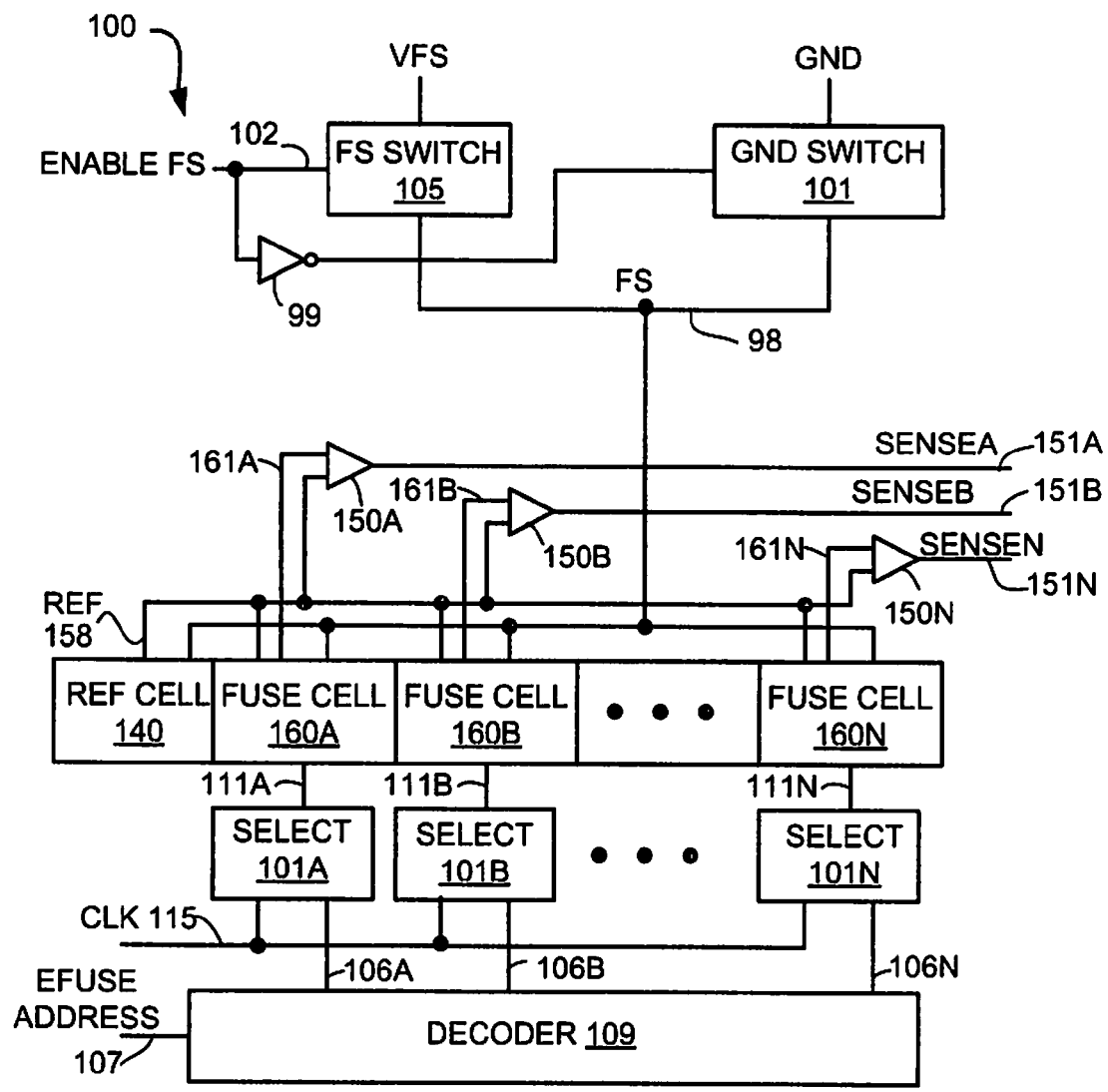
FIG. 2 depicts a prior art eFuse system.

Referring now to FIG. 2, prior art eFuse system 100 is shown in block diagram form. A reference cell 140 provides a reference voltage 158 that is distributed to one or more eFuse cells 160, shown as eFuse cells 160A-160N. A voltage supply VFS supplies a voltage, (e.g., 3.5 volts, a relatively high voltage, for current semiconductor technologies) that is connected to node SOURCE FS 98 when enable fuse source (ENABLE FS) 102 is active. The voltage supplied by VFS is suitable for blowing an eFuse in an eFuse cell 160. It is understood that, as eFuse technology advances, that VFS, in the future, may not be of significantly higher voltage than VDD. VFS, in fact, may actually be VDD in applications where VDD is of sufficient voltage to blow an eFuse. FS switch 105 must have a low enough electrical resistance to accommodate blowing an eFuse in an eFuse cell 160. In some embodiments, FS switch 105 is physically on the same chip as the remainder of eFuse system 100. In other embodiments, FS switch 105 is physically implemented off the chip and is mounted, e.g., on a card upon which the chip is mounted, with node SOURCE FS 98 being coupled onto the chip. Inverter 99 inverts ENABLE FS 102 to control GND switch 101 to couple SOURCE FS 98 to ground when ENABLE FS 102 is not controlling FS switch 105 to couple SOURCE FS 98 to VFS.

When ENABLE FS 102 is inactive, the VFS voltage supplied via FS Switch 105 to node source FS 98 is disconnected and node SOURCE FS 98 is connected to ground by GND Switch 101. GND switch 101 must be designed to withstand the voltage supplied from VFS through FS switch 105, in particular, if VFS is a higher voltage than VDD. For example, use of stacked NFETs with suitable voltages coupled to gates of the NFETs is a known way to provide switch capability while avoiding stress on any NFET. In some embodiments, GND switch 101 is physically on the same chip as the remainder of eFuse system 100. In other embodiments, GND switch 101 is physically implemented off the chip and is mounted, e.g., on a card upon which the chip is mounted, with node source FS 98 being coupled onto the chip. In an application, both FS switch 105 and GND switch 101 are physically implemented off the chip that the remainder of eFuse system 100 and source FS 98 is coupled onto the chip.

Each eFuse cell 160 produces an eFuse cell voltage output 161, shown in FIG. 2 as 161A-161N from eFuse cells 160A-160N, respectively. In FIG. 2, comparators 150A-150N each compare an eFuse cell voltage output 161 with the reference voltage and produces a logical "1" or a logical "0" responsive to whether the eFuse cell voltage output 161 input to a particular comparator 150 is greater than or less than the reference voltage 158. For example, comparator 150A compares eFuse cell voltage output 161A with reference voltage 158 and comparator 150A outputs a logical "1" if eFuse cell voltage output 161A is greater than reference voltage 158, signifying that the eFuse in eFuse cell 160A has been blown. If the eFuse in eFuse cell 160A has not been blown, eFuse cell voltage output 161A is less than reference voltage 158, and comparator 150A outputs a logical "0". Comparators 150A-150N are powered by a suitable comparator voltage supply. Typically, a comparator 150 on a chip is powered by VDD as a suitable comparator voltage supply, although other voltage supplies are contemplated. A comparator 150 has to have an operable input voltage range that accommodates reference voltage 158 and an eFuse cell voltage output.

Decoder 109 receives an eFuse address 107 and, responsive to a value driven on eFuse address 107, activates a select signal 106, shown as 106A-106N coupled to select circuits 101A-101N, respectively. Select circuits 101A-101N also receive a clock 115 that is activated when an eFuse cell 160 is to be programmed. For example, if decoder 109 receives an eFuse address 107 that is the address for eFuse cell 160A, then select signal 106A is activated to a "1". When clock 115 is activated ("1"), a signal 111A is driven active to eFuse cell 160A. Signals 111B-111N are inactive when signal 111A is selected. At the same time, ENABLE FS 102 is activated, causing FS switch 105 to couple voltage VFS to FS 98, and to prevent GND switch 101 from coupling source FS 98 to ground. An eFuse in eFuse cell 160A is blown when signal 111A is active at the same time that node SOURCE FS 98 is coupled to VFS by FS switch 105.

Figure 3:
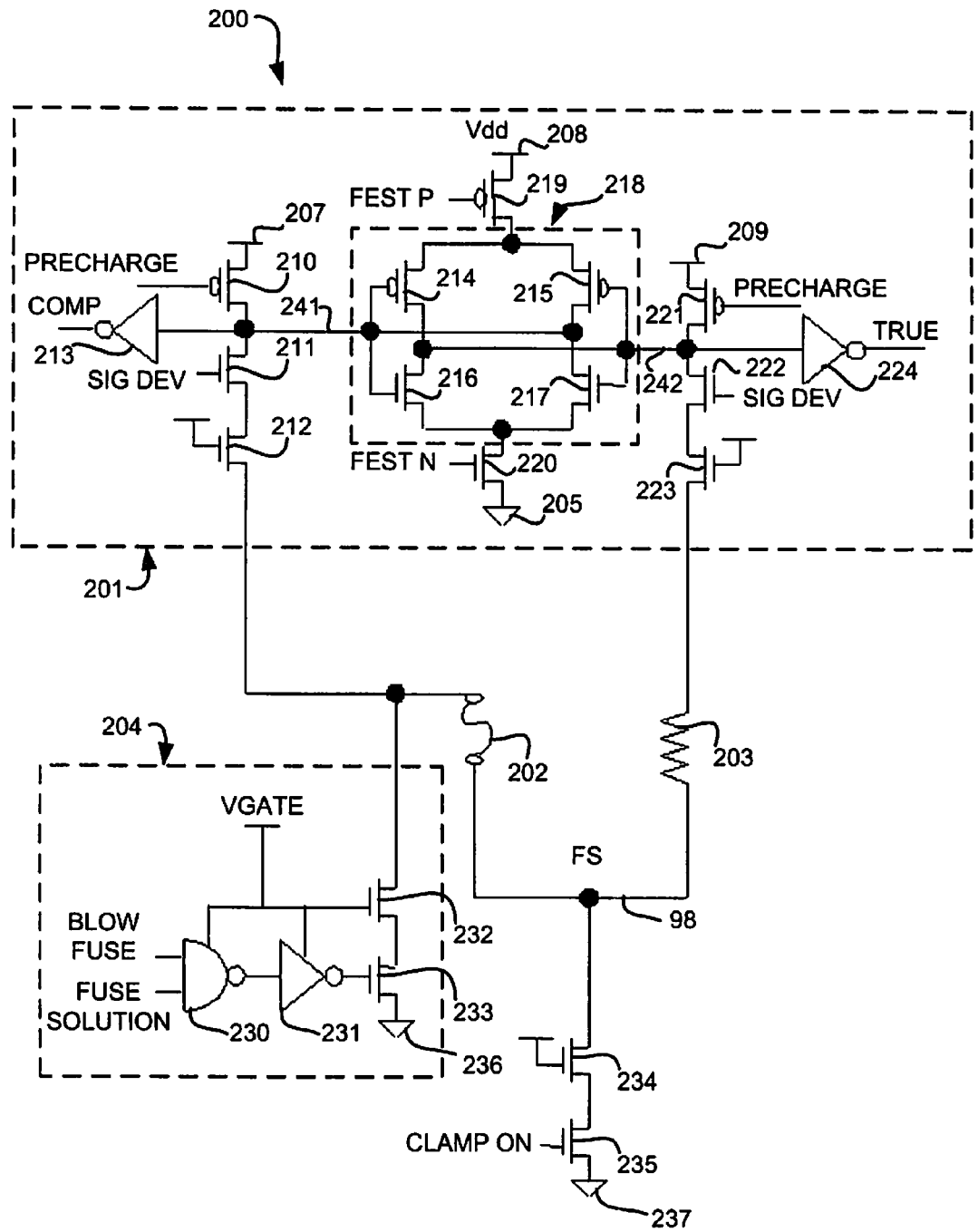
FIG. 3 depicts a prior art eFuse circuit.
Figure 4:
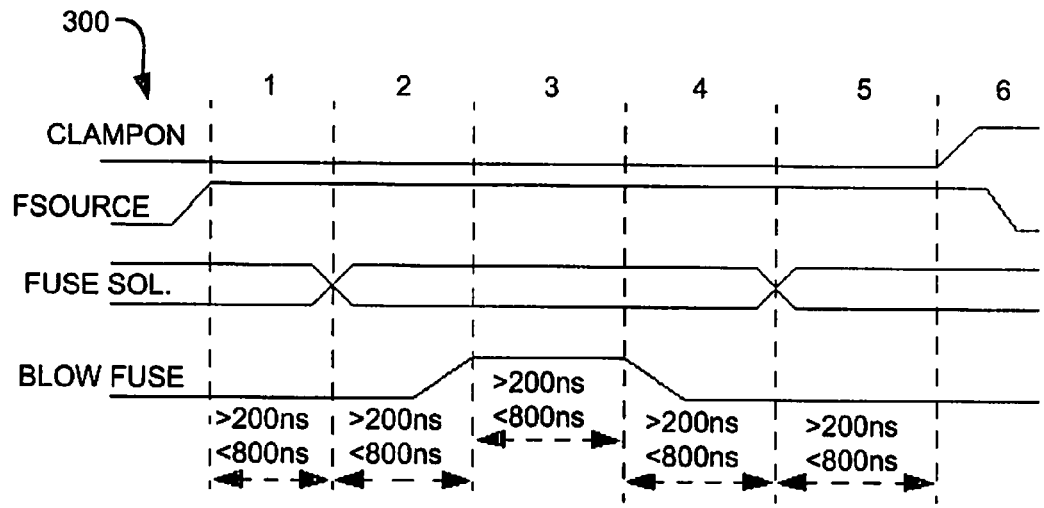
FIG. 4 depicts the prior art process of blowing an eFuse link in waveform format.

Referring now to FIG. 3, an eFuse circuit 200 is described. eFuse circuit 200 consists of sense circuitry 201, blow circuitry 204, eFuse link 202, reference resistor 203, source FS 98, NFETs 234 and 235, and ground 237. Blow circuitry 204 is supplied by voltage supply VGATE which for the purposes of embodiment 200 is the same magnitude as Vdd, the voltage supply for sense circuitry 201. In other embodiments however, VGATE and Vdd may be different magnitudes. The process of blowing eFuse link 202 is provided by waveform diagram 300 in FIG. 4, and herein described. In window 1, of FIG. 4, source FS 98 is brought high and held. In window 2, of FIG. 4, the state of FUSE SOLUTION is determined and held. The BLOW FUSE signal begins to rise toward the end of window 2. In window 3, of FIG. 4, BLOW FUSE is held high. If FUSE SOLUTION is also high, NAND gate 230 will output a '0'. The '0' is then inverted to a '1' by inverter 231 and passed to NFETs 232 and 233. Upon receipt of a '1', NFETs 232 and 233 are activated resulting in a path to ground 235 from source FS 98 through fuse link 202. eFuse link 202 is generally designed such that the current passing from source FS 98 though link 202 over a specified amount of time causes eFuse link 202 to blow (i.e. rupture, electrical migration of silicide, etc.) and become highly resistive as compared to the previous unblown state of link 202. In window 4, of FIG. 4, BLOW FUSE drops from a '1' to a '0' thereby closing the path from source FS 98 to ground 236. In window 5, of FIG. 4, FUSE SOLUTION is free to switch. Finally in window 6, of FIG. 4, CLAMP ON turns from a '0' to a '1' activating NFETs 234 and 235 resulting in a path from source FS 98 to ground 237.

Figure 5:
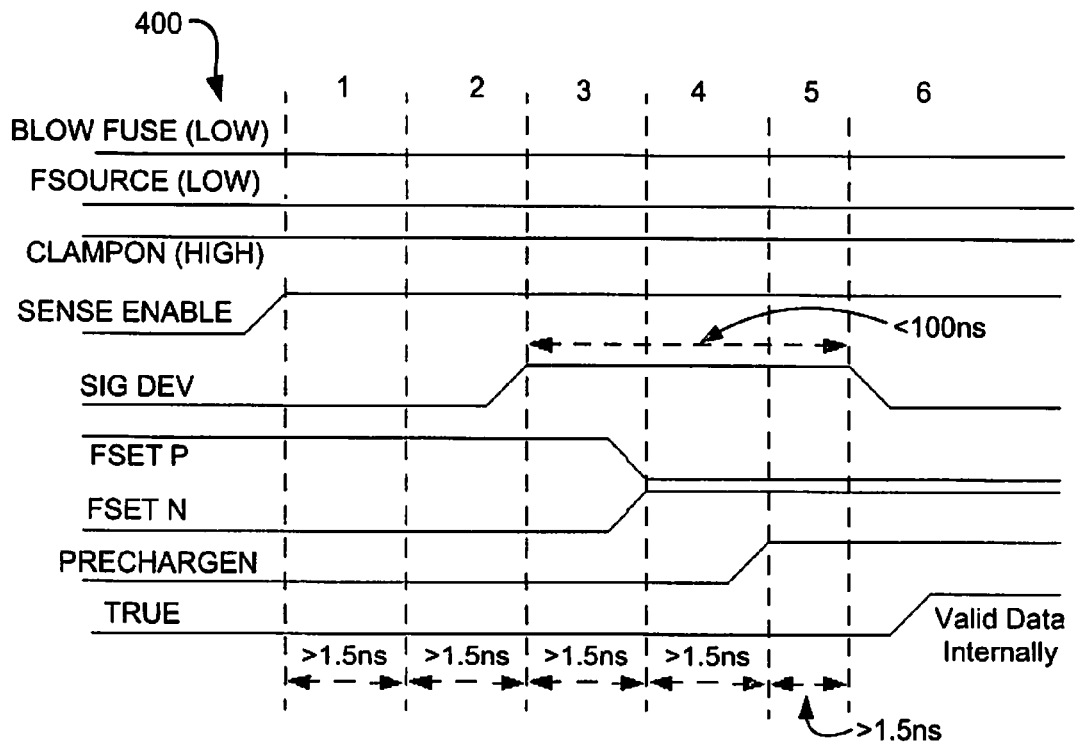
FIG. 5 depicts the prior art process of sensing whether the eFuse link has been blown in wave form format.

The process of sensing whether eFuse link 202 has been blown is provided by waveform diagram 400 in FIG. 5, and herein described. In window 1, of FIG. 5, SENSE ENABLE goes high and is held. SENSE ENABLE generally is a sense enable signal allowing sense circuitry 201 to begin sensing whether eFuse link 202 has or has not been blown.

In window 2, of FIG. 5, SIG DEV rises activating NFETs 211 and 222 resulting in current through the two paths of the circuit. One path through node 207, PFET 210, NFETs 211 and 212, eFuse link 202, NFETs 234 and 235, and finally to ground 237. The other path through node 209, PFET 221, NFETs 222 and 223, reference resistor 203, NFETs 234 and 235, and finally to ground 237.

In window 3, of FIG. 5, FSET P and FSET N become active. This results in the voltage of node 241 and the voltage of node 242 to stabilize depending on the difference of resistance magnitudes of reference resistor 203 and eFuse link 202. If eFuse link 202 has not been blown, the resistance of eFuse link 202 is less than the resistance of reference resistor 203. This causes a lesser voltage at node 241 than the voltage at node 242. If eFuse link 202 has been blown, the voltage at node 241 is greater than the voltage at node 242.

In window 4, of FIG. 5, FSET P and FSET N are fully active thereby activating PFET 219 and NFET 220 and cross coupled inverter latch 215. Cross coupled inverter latch 218 generally amplifies the voltage difference between the voltage at node 241 and the voltage at node 242 to provide for more robust sensing capability.

In window 5, of FIG. 5, PRECHARGE switches high from a '0' to a '1' deactivating PFETs 210 and 221. In window 6, of FIG. 5, SIG DEV switches low from a '1' to a '0' deactivating NFETs 211 and 222. The process steps described in windows 5 and 6 isolate cross coupled inverter latch 218 from the outside influence of the two paths (i.e. node 207 through link 202, and node 209 through reference resistor 203). After SIG DEV switches low, from '1' to '0', the TRUE and COMP outputs reflect the state of cross coupled inverter latch 218. For example, when eFuse link 202 has been blown and cross coupled inverter latch 218 has been activated, a '1' is passed to inverter 213 and a '0' is passed to inverter 224. Inverter 213 and 224 then invert the signals, thereby resulting in COMP being low '0' and TRUE being high '1'. A separate latch (i.e. shadow latch), not shown in FIG. 3 stores the value of TRUE and COMP and is scannable (i.e. a latch part of a JTAG boundary scan chain, LSSD scan chain, etc).

Figure 6A:
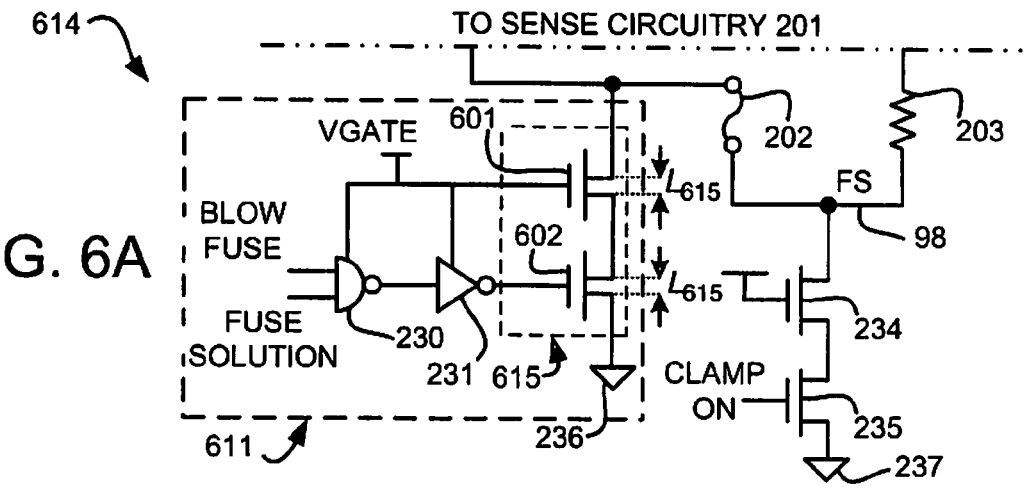
FIG. 6A depicts an eFuse circuit having blow circuitry configured to provide a first large amount of current through the eFuse link.
Figure 6B:
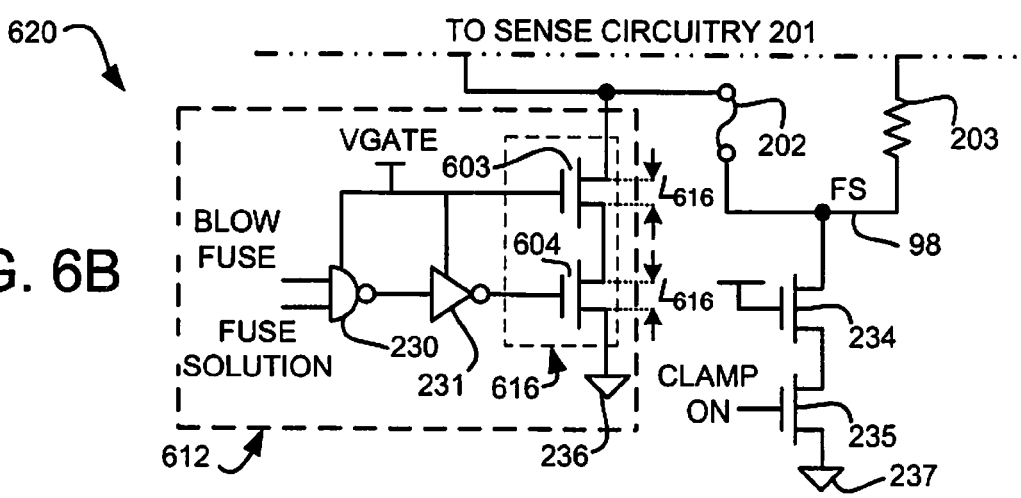
FIG. 6B depicts an eFuse circuit having blow circuitry configured to provide a second amount of current, less than the first amount of current, through the eFuse link.
Figure 6C:
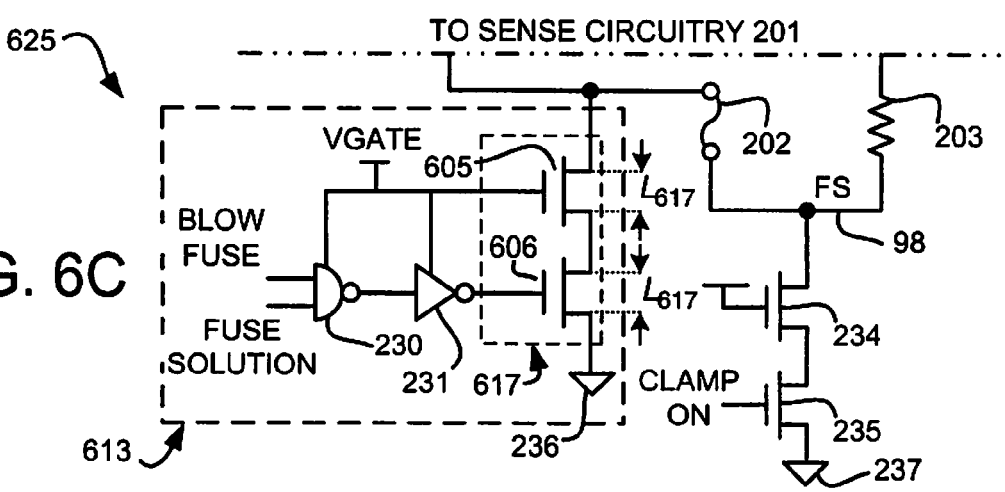
FIG. 6C depicts an eFuse circuit having blow circuitry configured to provide a third amount of current, less than the second amount of current, through the eFuse link.

Referring now to FIGS. 6A, 6B, and 6C a first embodiment of the invention is depicted. FIGS. 6A, 6B, and 6C depict eFuse circuits 614, 620, and 625 respectively, each eFuse circuit having blow circuitry 611, 612, and 613 respectively. eFuse circuits 614, 620, and 625 depict particular examples of eFuse circuits that are contained within a monitor bank 621 described in detail below.

Blow circuitry 611 utilizes channel length varied transistors 615, as shown as individual NFETs 601 and 602. Blow circuitry 612 utilizes channel length varied transistors 616, as shown as individual NFETs 603 and 604. Blow circuitry 613 utilizes channel length varied transistors 617, as shown as individual NFETs 605 and 606. NFETs 601 and 602 have a channel length $L_{615}$, NFETs 603 and 604 have a channel length $L_{616}$, and NFETs 605 and 606 have a channel length $L_{617}$. Channel length $L_{615}$ is less than channel length $L_{616}$ which is less than channel length $L_{617}$. The amount of current that travels through a transistor is inversely proportional to the channel length, wherein reducing the transistor channel length in half resultantly doubles the amount of current passing through the transistor. Therefore the amount of current traveling through channel length varied transistors 615 is greater than the amount of current traveling through channel length varied transistors 616 which is greater than the amount of current traveling through channel length varied transistors 617.

In an alternative embodiment NFETs 602, 604, and 606 do not have the same channel length as NFETs 601, 603, and 605. NFETs 602, 604, and 606 may be configured with a similar channel length to each other but having a relatively smaller channel length than NFETs 601, 603, and 605.

Figure 7A:
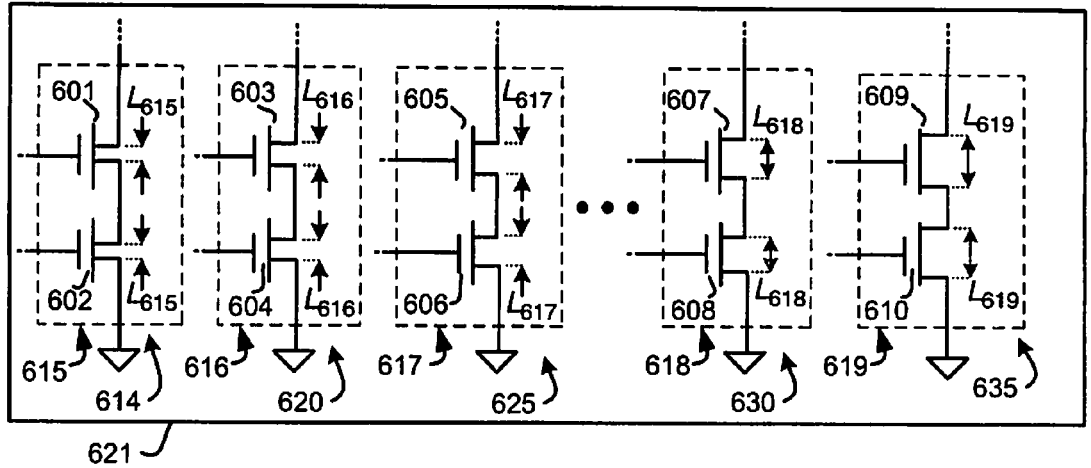
FIG. 7A depicts a monitor bank consisting of multiple eFuse circuits each eFuse circuit having blow circuitry configured, with channel length varied transistors, to provide different amounts of current through each eFuse link.

Referring now to FIG. 7A a second embodiment of the invention is depicted. Monitor bank 621 contains a plurality of eFuse circuits 614, 620, 625, 630, and 635, herein collectively referred to as test eFuse circuits. For simplicity only channel length varied transistors 615, 616, 617, 618, and 619 are shown. eFuse circuits 630 and 635 are similar to eFuse circuits 614, 620 and 625. However eFuse circuits 630 and 635 utilize channel length varied transistors 618 and 619 respectively. Channel length varied transistors 618 are shown as NFET transistors 607 and 608 each having a channel length $L_{618}$. Channel length varied transistors 619 are shown as NFET transistors 609 and 610 each having a channel length $L_{619}$.

The test eFuse circuits contained in monitor bank 621 represent functional eFuse circuits (i.e. the monitor bank of test eFuses portrays, depicts, and presents the likeness of the functional eFuse circuits), and are programmed distinctively (i.e. at separate time instances) from the functional eFuse circuits. eFuse circuits are considered functional if the behavior of a electrical system varies when the functional eFuses are intact when compared to the behavior of the electrical system when the eFuses are blown. Because functional eFuse circuits modify electrical device functionality, it is beneficial for a particular eFuse circuit to fully blow when the eFuse circuit is programmed.

In a particular embodiment each test eFuse circuit contained in monitor bank 621 can be programmed separately upon programming monitor bank 621. For example the test eFuses are programmed by the following process: program eFuse circuit 614, then program eFuse circuit 620, then program eFuse circuit 625, then program eFuse circuit 630, and then program eFuse circuit 635. Upon completion of this process, monitor bank 621 may be considered programmed. It is to be noted that the process for programming monitor bank described above may be completed in a very short time. Therefore the test eFuse circuits may appear to be programmed simultaneously.

In an alternative embodiment test eFuse circuits contained in monitor bank 621 may actually be programmed simultaneously.

In yet another alternative embodiment monitor bank 621 may be configured with a large number of test eFuse circuits (instead of having multiple different monitor banks 621 with a smaller number of test eFuse circuits). In this configuration a first group of test eFuse circuits within monitor bank 621 may be programmed together, leaving a second group of test eFuse circuits within monitor bank 621 to be programmed at a later time.

When monitor bank 621 is programmed, an amount of current travels through each individual test eFuse. For example eFuse circuit 614 is configured with channel length varied transistors 615 having a first channel length $L_{615}$, resulting in a first amount of current passing through eFuse link 202 of eFuse circuit 614. In a particular embodiment, the amount of current traveling through eFuse link 202 of eFuse circuit 614 is configured to expectedly always blow eFuse link 202 of eFuse circuit 614.

Similarly eFuse circuit 620 is configured with channel length varied transistors 616 having a second channel length $L_{616}$, resulting in a second amount of current passing through eFuse link 202 of eFuse circuit 620. eFuse circuit 625 is configured with channel length varied transistors 617 having a third channel length $L_{617}$, resulting in a third amount of current passing through eFuse link 202 of eFuse circuit 625. eFuse circuit 630 is configured with channel length varied transistors 618 having a fourth channel length $L_{618}$, resulting in a fourth amount of current passing through eFuse link 202 of eFuse circuit 630. eFuse circuit 635 is configured with channel length varied transistors 619 having a fifth channel length $L_{619}$, resulting in a fifth amount of current passing through eFuse link 202 of eFuse circuit 635.

In a particular embodiment the first channel length $L_{615}$ is smaller than the second channel length $L_{616}$. The second channel length $L_{616}$ is smaller than the third channel length $L_{617}$. The third channel length $L_{617}$ is smaller than the fourth channel length $L_{618}$. The fourth channel length $L_{618}$ is smaller than the fifth channel length $L_{619}$. This results in the first amount of current being larger than the second amount of current, the second amount of current being larger than the third amount of current, the third amount of current being larger than the fourth amount of current, and the fourth amount of current being larger than the fifth amount of current.

In another embodiment, the amount of current traveling through eFuse link 202 of eFuse circuit 635 is configured to expectedly never blow eFuse link 202 of eFuse circuit 635. In yet another embodiment the test eFuse circuits in monitor bank are arranged in a sequential order wherein the eFuse circuit 614 is configured to expectedly always blow upon programming (i.e. it is easy to blow), and subsequent eFuse circuits 620, 625, and 630 are configured to get sequentially harder to blow. eFuse circuit 635 is configured to expectedly never blow. Arranging the test eFuse circuits in monitor bank 621 in a sequential order (i.e. from easy to blow to hard to blow) aids in determining whether each individual test eFuse circuit has or has not been blown. When one determines an inflection point where the test eFuse circuits change from being blown to unblown, one can expect that all of the subsequent eFuse links 202 of the test eFuse circuits are also unblown. In this particular embodiment monitor bank 621 being programmed results in a first group of one or more test eFuse circuits having a blown eFuse link 202, and a second group of one or more test eFuse circuits having a unblown eFuse link 202. For example, upon programming, it is determined that eFuse circuits 614 and 620 have a blown eFuse link 202, because the amount of current passing through the eFuse links 202 of eFuse circuits 614 and 620 was sufficient to effectively blow the eFuse links 202 of eFuse circuits 614 and 620. It is also determined that eFuse circuits 625, 630, and 635 have an unblown eFuse link 202, because the amount of current passing through the eFuse links 202 of eFuse circuits 625, 630, and 635 was not sufficient to effectively blow the eFuse links 202 of eFuse circuits 625, 630, and 635.

Figure 7B:
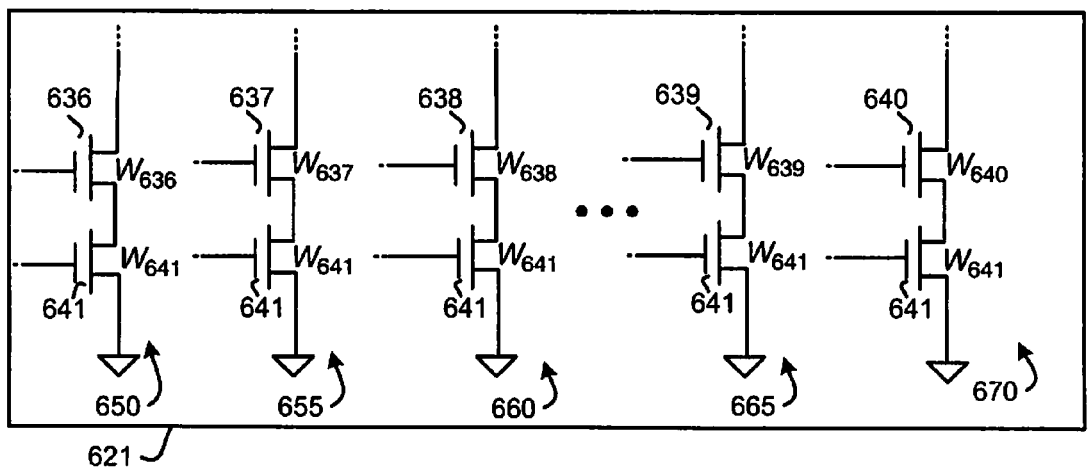
FIG. 7B depicts a monitor bank consisting of multiple eFuse circuits each eFuse circuit having blow circuitry configured, with gate width varied transistors, to provide different amounts of current through each eFuse link.

Referring now to FIG. 7B, monitor bank 621 consists of multiple test eFuse circuits 650, 655, 660, 665, and 670. Each test eFuse circuit utilizes gate width varied NFETs 636-640, to provide different amounts of current through each eFuse link 202. For example test eFuse circuit 650 utilizes gate width varied NFET 636 having a first gate width $W_{636}$, resulting in a first amount of current passing through eFuse link 202 of test eFuse circuit 650. In a particular embodiment, the amount of current passing through eFuse link 202 of test eFuse circuit 650 is configured to expectedly always blow eFuse link 202 of test eFuse circuit 650.

Similarly test eFuse circuit 655 utilizes gate width varied NFET 637 having a second gate width $W_{637}$, resulting in a second amount of current passing through eFuse link 202 of test eFuse circuit 655. Test eFuse circuit 660 utilizes gate width varied NFET 638 having a third gate width $W_{638}$, resulting in a third amount of current passing through eFuse link 202 of test eFuse circuit 660. Test eFuse circuit 665 utilizes gate width varied NFET 639 having a fourth gate width $W_{639}$, resulting in a fourth amount of current passing through eFuse link 202 of test eFuse circuit 665. Test eFuse circuit 670 utilizes gate width varied NFET 640 having a fifth gate width $W_{640}$, resulting in a fifth amount of current passing through eFuse link 202 of test eFuse circuit 670. In essence each test eFuse circuit 650, 655, 660, 665, and 670 utilize one or more varying circuit parameter(s) to affect the amount of current passing through each eFuse link.

In a particular embodiment the first gate width $W_{636}$ is larger than the second gate width $W_{637}$. The second gate width $W_{637}$ is larger than the third gate width $W_{638}$. The third gate width $W_{638}$ is larger than the fourth gate width $W_{639}$. The fourth gate width $W_{639}$ is larger than the fifth gate width $W_{640}$. This results in the first amount of current being larger than the second amount of current, the second amount of current being larger than the third amount of current, the third amount of current being larger than the fourth amount of current, and the fourth amount of current being larger than the fifth amount of current.

In another embodiment, the amount of current traveling through eFuse link 202 of eFuse circuit 670 is configured to expectedly never blow eFuse link 202 of eFuse circuit 670. In yet another embodiment the test eFuse circuits in monitor bank are arranged in a sequential order wherein the eFuse circuit 650 is configured to expectedly always blow upon programming (i.e. it is easy to blow), and subsequent eFuse circuits 655, 660, and 665 are configured to get sequentially harder to blow. eFuse circuit 670 is configured to expectedly never blow.

In another embodiment each eFuse circuit 650, 655, 660, 665, and 670 utilizes NFET 641 as a protective NFET to aid in blocking the current path through eFuse link 202. NFETs 641 have a particular gate width $W_{641}$ that is relatively small compared to gate widths $W_{636}$-$W_{640}$.

Figure 8:
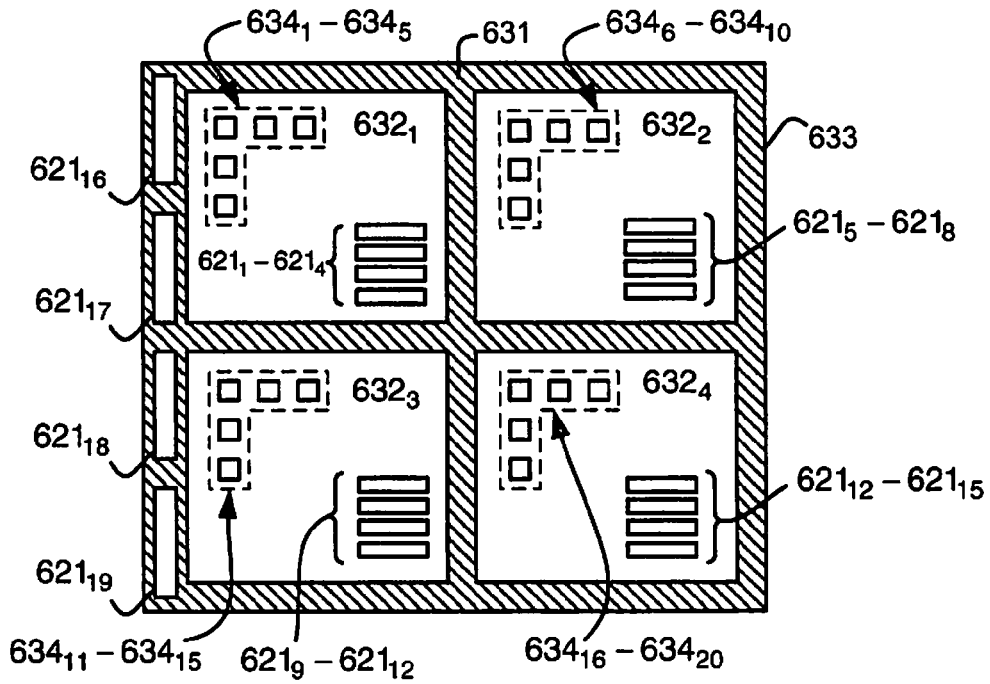
FIG. 8 depicts examples of various locations of one or more monitor banks.

Referring now to FIG. 8, potential locations of monitor bank 621 are depicted. Semiconductor wafer 633 is manufactured with a plurality of chips $632_1$-$632_4$, herein collectively referred to as chips 632. Separating each chip 632 is a kerf area 631. In a particular example a plurality of monitor banks $621_1$-$621_4$ are located within chip $632_1$. Within chip $632_1$, monitor banks $621_1$-$621_4$ represent functional eFuse circuits $634_1$-$634_5$. Therefore when chip $632_1$ is packaged for installation into an electronic system, integrated circuit $632_1$ contains both types of eFuse circuits: functional eFuse circuits $634_1$-$634_5$ and test eFuse circuits contained in monitor banks $621_1$-$621_4$. By placing monitor banks $621_1$-$621_4$ on chip $632_1$, later to be packaged and installed into an electronic system, gives added benefits and functionality to chip $632_1$. During chip $632_1$ packaging, or alternatively prior to placement into the stream of commerce, at least one monitor bank (i.e. monitor bank $621_1$) may be programmed in order to determine if the functional eFuse circuits $634_1$-$634_5$ will blow successfully. If however chip $632_1$ is packaged and installed into an electronic device and is defective, at least one monitor bank (i.e. monitor bank $621_2$) may be programmed. By programming monitor bank $621_2$ subsequent to a determination that chip $632_1$ is defective, the resulting programming data, later described in FIG. 9A, will aid a test engineer in determining potential reasons why functional eFuse circuits $634_1$-$634_5$ did not blow successfully when programmed. For example, in many electronic systems utilizing eFuses the device may be returned to the manufacturer because the system malfunctioned. In these systems, the manufacturer is unable to obtain information directly from each individual eFuse (i.e. the manufacturer can not determine the state (blown or unblown) of the eFuse). Therefore by adding a monitor bank 621 to an electronic system, the manufacturer is able to program one or more test eFuse circuits contained within monitor bank 621 in order to determine whether the particular functional eFuse configuration had previously blown successfully.

In an alternative embodiment, monitor banks $621_{12}$-$621_{15}$ are programmed in order to aid in the electronic system debug process. In this particular embodiment chip $632_4$ is packaged and installed and integrated into an electronic system. Chip $632_4$ utilizes functional eFuse circuits $634_{16}$-$634_{20}$ that will be programmed after the electronic system has left the control of the electronic system manufacturer. In this particular embodiment the test eFuse circuits utilize parameters selected to isolate a particular eFuse degradation characteristic. For instance, monitor bank $621_{12}$ utilizes a plurality of test eFuses with varying circuit parameters configured to isolate a first particular eFuse degradation characteristic (i.e. temperature, NFET threshold variation, silicide thickness variation, etc.). Similarly, monitor bank $621_{13}$, $621_{14}$, and $621_{15}$ utilize a plurality of test eFuses with varying circuit parameters configured to each isolate a second, third, and fourth particular eFuse degradation characteristic respectively. A eFuse degradation characteristic may be isolated by designing the test eFuse circuit by selecting circuit parameter(s) so that the particular characteristic would have an heightened affect on the circuit parameter(s). Upon programming, the output (i.e. whether the eFuse has or has not blown successfully) of each test eFuse circuit in each monitor bank $621_{12}$-$621_{15}$ may be read in the form of an bit line blow pattern (discussed in further detail below). Because each monitor bank $621_{12}$-$621_{15}$ utilizes eFuse circuits with parameters selected to isolate a particular characteristic, the expected bit line blow pattern of each monitor bank may be dissimilar when compared to each other. When monitor banks $621_{12}$-$621_{15}$ are programmed an actual bit line blow pattern results and is compared with the expected bit line blow pattern. If the actual bit line blow pattern of a particular monitor bank matches a predetermined expected acceptable bit line blow pattern the eFuse degradation characteristic isolated by the particular monitor bank has potentially not affected the success of eFuse programming. If the actual bit line blow pattern of a particular monitor bank does not match a predetermined expected acceptable bit line blow pattern the eFuse degradation characteristic isolated by the particular monitor bank has potentially affected the success of eFuse programming. Therefore the parameters in the functional eFuses may be adapted to compensate for the eFuse degradation that has been identified. For example the bit line blow patterns of a monitor bank isolating silicide thickness variation do not match when the monitor bank is programming. It is determined that the silicide thickness variation has caused the eFuses to be more difficult to blow by a certain value above what was expected. This difference is utilized to determine how to adjust the parameter(s) (i.e. increase the time the blow current is traveling through the eFuse link, increase the amount of blow current, etc) of the functional eFuses in the electrical system.

As shown in FIG. 8 at least one monitor bank 621 may be located on the kerf area 631 of silicone wafer 633. For example monitor banks $621_{16}$-$621_{19}$ represent all the functional eFuse circuits $634_1$-$634_{20}$ located on silicone wafer 633. During silicone wafer 633 manufacturing, the test eFuse circuits located in monitor banks $621_{16}$-$621_{19}$ are susceptible to the same manufacturing conditions as the functional eFuse circuits $634_1$-$634_{20}$, and therefore are expected to have similar variations. Therefore at least one monitor bank $621_{16}$-$621_{19}$ may be programmed in order to determine if the test eFuse circuits, contained within, blow successfully. If the test eFuse circuits in the at least one monitor bank $621_{16}$-$621_{19}$ blow successfully, it is expected that the functional eFuse circuits $634_1$-$634_{20}$ will also blow successfully.

Figure 9A:
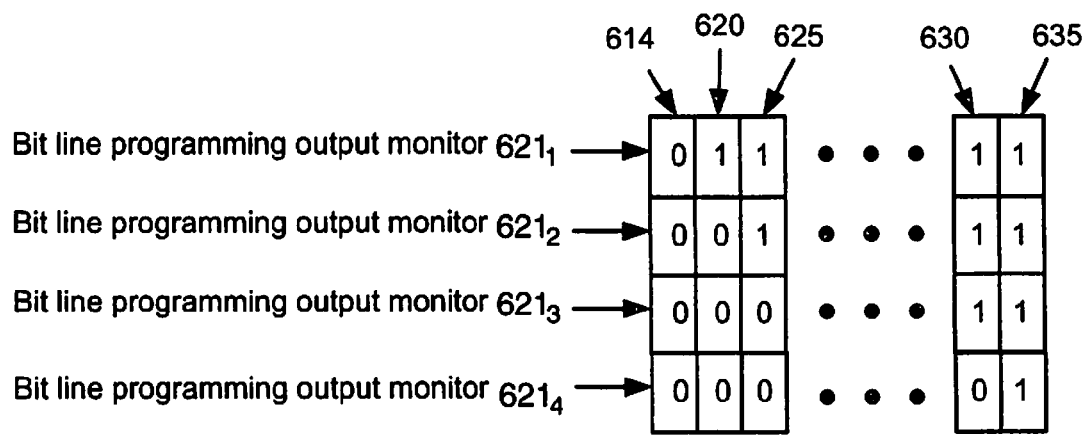
FIG. 9A depicts examples of bit line blow program representing the programming results of multiple monitor banks.

When a monitor bank 621 is programmed the resulting programming data can be arranged in a bit line blow pattern, as shown in FIG. 9A. The test eFuse circuits (i.e. 614, 620, 625, 630, and 635) may be configured to output a '0' when the test eFuse circuit blows and a '1' if the test eFuse circuit remains unblown. For example monitor bank $621_1$ is programmed and the output (i.e. either a '0' or a '1') from each test eFuse circuit contained within monitor bank $621_1$ are arranged in a bit line blow pattern. For example, eFuse circuit 614 blows and outputs a '0'. The remaining eFuse circuits: 620, 625, 630, and 635 do not blow and output a '1'. At the same or a subsequent time, on the same or different electronic system, a second monitor bank $621_2$ is programmed. In this instance, eFuse circuits 614 and 620 blow and output a '0'. The remaining eFuse circuits: 625, 630, and 635 do not blow and output a '1'. At the same or a subsequent time, on the same or different electronic system, a third monitor bank $621_3$ is programmed. In this instance, eFuse circuits 614, 620, and 625 blow and output a '0'. The remaining eFuse circuits: 630 and 635 do not blow and output a '1'. At the same or a subsequent time, on the same or different electronic system, a fourth monitor bank $621_4$ is programmed. In this instance, eFuse circuits 614, 620, 625, and 630 blow and output a '0'. The remaining eFuse circuit 635 did not blow and outputs a '1'. The bit line blow pattern may be read by an external testing device (not shown) or stored in the electronic system for later use.

FIG. 9B depicts expected output bit line patterns of a monitor bank 621 containing ten eFuse circuits 810-819. The ideal expected bit line blow pattern is demonstrated by monitor bank $621_e$. An acceptable tolerance of bit line blow patterns, may be utilized and are demonstrated by bit line blow patterns corresponding to monitor banks $621_{e-1}$ and $621_{e+1}$. The bit line blow patterns of monitor banks $621_{e-1}$, $621_e$, and $621_{e+1}$ may be an actual pattern (i.e. monitor bank $621_{e+1}$ actually was programmed) or a theoretical pattern determined by utilizing the known design properties of the electronic system having a monitor bank 621. An acceptable inflection point, (i.e. the test eFuse circuit where the sequential bank of test eFuse circuits change from being unblown to blown, or alternatively blown to unblown) as demonstrated by monitor bank $621_{e-1}$ is test eFuse circuit 814. The ideal inflection point as demonstrated by the bit line blow pattern corresponding to monitor bank $621_e$ is test eFuse circuit 815. Another acceptable inflection point as demonstrated by the bit line blow pattern corresponding to monitor bank $621_{e+1}$ is test eFuse circuit 816.

FIG. 9C depicts examples of actual bit line blow patterns of a monitor bank 621 containing ten eFuse circuits 810-819. Monitor banks $621_s$-$621_z$ are programmed and thereby output a corresponding bit line blow pattern. The bit line blow pattern of monitor bank 621S is compared with acceptable patterns $621_{e-1}$, $621_e$, and $621_{e+1}$. Since the bit line blow pattern of monitor bank 621 matches acceptable pattern $621_{e-1}$ the test eFuses contained in monitor bank $621_s$ have blown successfully. This same process is used to determine that the output patterns of monitor banks $621_t$ and $621_u$ both match acceptable patterns $621_e$ and $621_{e+1}$ respectively. Therefore the test eFuses in monitor banks $621_t$ and $621_u$ have blown successfully.

If it is determined that the test eFuse circuits located in a monitor bank 621 have blown successfully it is expected that the functional eFuse circuits, represented by the test eFuse circuits in the monitor bank 621, will blow successfully when programmed.

The bit line blow patterns corresponding to monitor banks $621_v$-$621_z$ do not match the acceptable patterns $621_{e-1}$, $621_e$, and $621_{e+1}$. Therefore the test eFuses in monitor banks $621_v$-$621_z$ have not blown successfully and it is expected that the functional eFuse circuits, represented by the test eFuse circuits in the monitor banks $621_v$-$621_z$, will not blow successfully when programmed. In a particular embodiment the electronic system, or chip to be installed into an electronic system may be rejected because the functional eFuses are anticipated not to blow successfully.

Figure 10A:
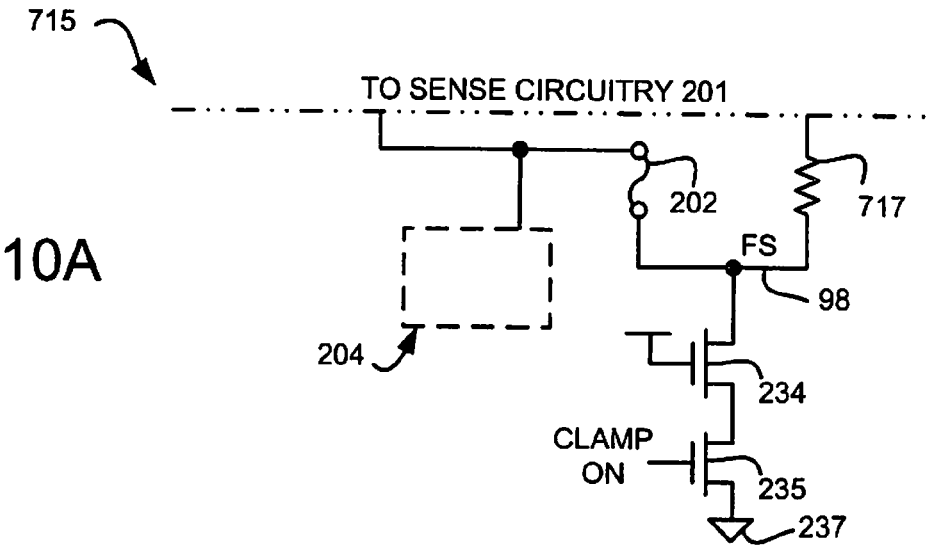
FIG. 10A depicts an eFuse circuit wherein the variable circuit components are not located in the eFuse blow circuitry.

Referring now to FIG. 10A depicting an alternative embodiment to the invention wherein eFuse circuit 715 utilizes other variable components not in blow circuitry 204 to determine if the functional eFuses have or will program successfully. For example eFuse link 716 has various characteristics that are modifiable (i.e. link resistance, link width and length, etc.). Using these modifiable characteristics, a plurality of eFuse circuits 715 may be arranged in a monitor bank 621. A first eFuse link 716 in a first eFuse circuit 715 may be configured with a first link resistance, length, or width. A second eFuse link 716 in a second eFuse circuit 715 may be configured with a second link resistance, length, or width. Further there may be a plurality of eFuse links 716 in a plurality of eFuse circuits 715 each have varying link resistance, length, or width. These plurality of eFuse circuits 715 may be arranged in a monitor bank successively, wherein the first eFuse link 716 always blows upon eFuse circuit 715 programming, the second eFuse link 716 never blows upon eFuse circuit 715 programming, and the plurality of eFuse circuit 715, each with varying eFuse links 716 arranged sequentially. Similarly reference resistor 717 may be modifiable. A first reference resistor 717 in a first eFuse circuit 715 may be configured with a first resistance. A second reference resistor 717 in a second eFuse circuit 715 may be configured with a second resistance. Further there may be a plurality of reference resistors 717 in a plurality of eFuse circuits 715 each have varying resistance.

Figure 10B:
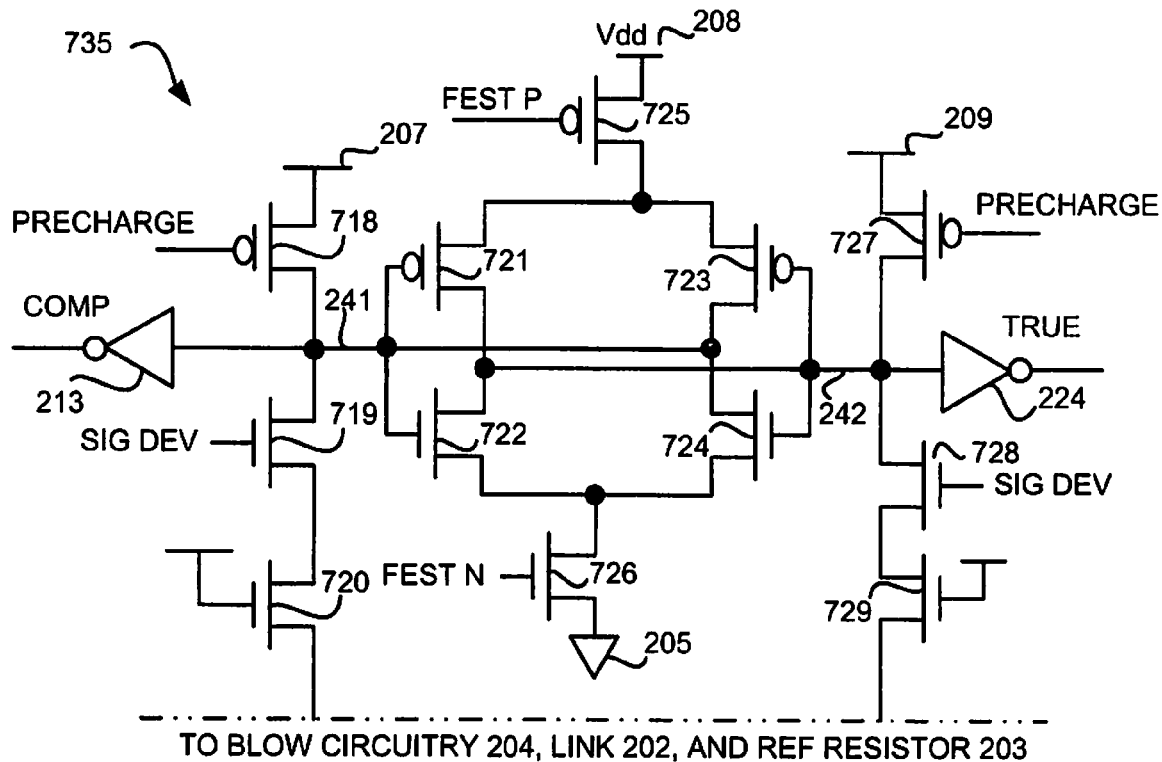
FIG. 10B depicts an eFuse circuit wherein the variable circuit components are located in the eFuse sense circuitry.

Referring now to FIG. 10B, alternative embodiments to the invention where multiple eFuse circuits 735, each with variable components in sense circuitry 201, are utilized to construct one or more monitor banks 621. In a particular embodiment the channel length of transistors (i.e. NFET, PFET, etc.) 718-729 may be varied in a similar manner to those of NFETs 601-610 so that a first eFuse circuit 735 contained within a monitor bank 621 utilizes at least one transistor 718-729 that has a varied channel length as compared to the same transistor 718-729 of a second eFuse circuit 735. In a second embodiment the channel lengths of any number of transistors 718-729 may be varied in a first eFuse circuit 735 as compared to the channel lengths of any number of transistors 718-729 in a second eFuse circuit 735 wherein the first and second eFuse circuits 735 are two of a plurality of eFuse circuits 735 in a monitor bank.

In a particular embodiment monitor bank 621 consists of a plurality of eFuse circuits each eFuse circuit having varying components relative to other eFuse circuits, the various components being: located in blow circuitry 204, (i.e. NFETs 232 and 233) located in sense circuitry 201, (i.e. transistors 718-729) eFuse link 716, and reference resistor 717. In this embodiment any number of individual components may be modified from a first individual eFuse circuit to a second individual eFuse circuit. For example in a first eFuse circuit located in monitor bank 621 NFETs 232 and 233 have a particular channel length, reference resistor 203 has a particular resistance, and NFETs 216 and 217 have a particular channel length. In a second eFuse circuit located in monitor bank 621 NFETs 232 and 233 have a particular increased channel length, reference resistor 203 has a particular increased resistance, and NFETs 216 and 217 have a particular increased channel length.

One skilled in the art will recognize that the eFuses may be initially in a non-conductive state and programmed to a non-conductive (blown) state, as described above or, alternatively, may initially be in a non-conductive state and programmed to a conductive state (the latter eFuses are commonly referred to as antifuses). Antifuses generally are comprised of two conductors separated by an insulator. Programming is accomplished by forming a conductive trace through the insulator, and changing an open to a conductive element. Examples of antifuses are described in detail in the commonly owned patent U.S. Pat. No. 6,753,590, herein incorporated by reference in its entirety.

Figure 11:
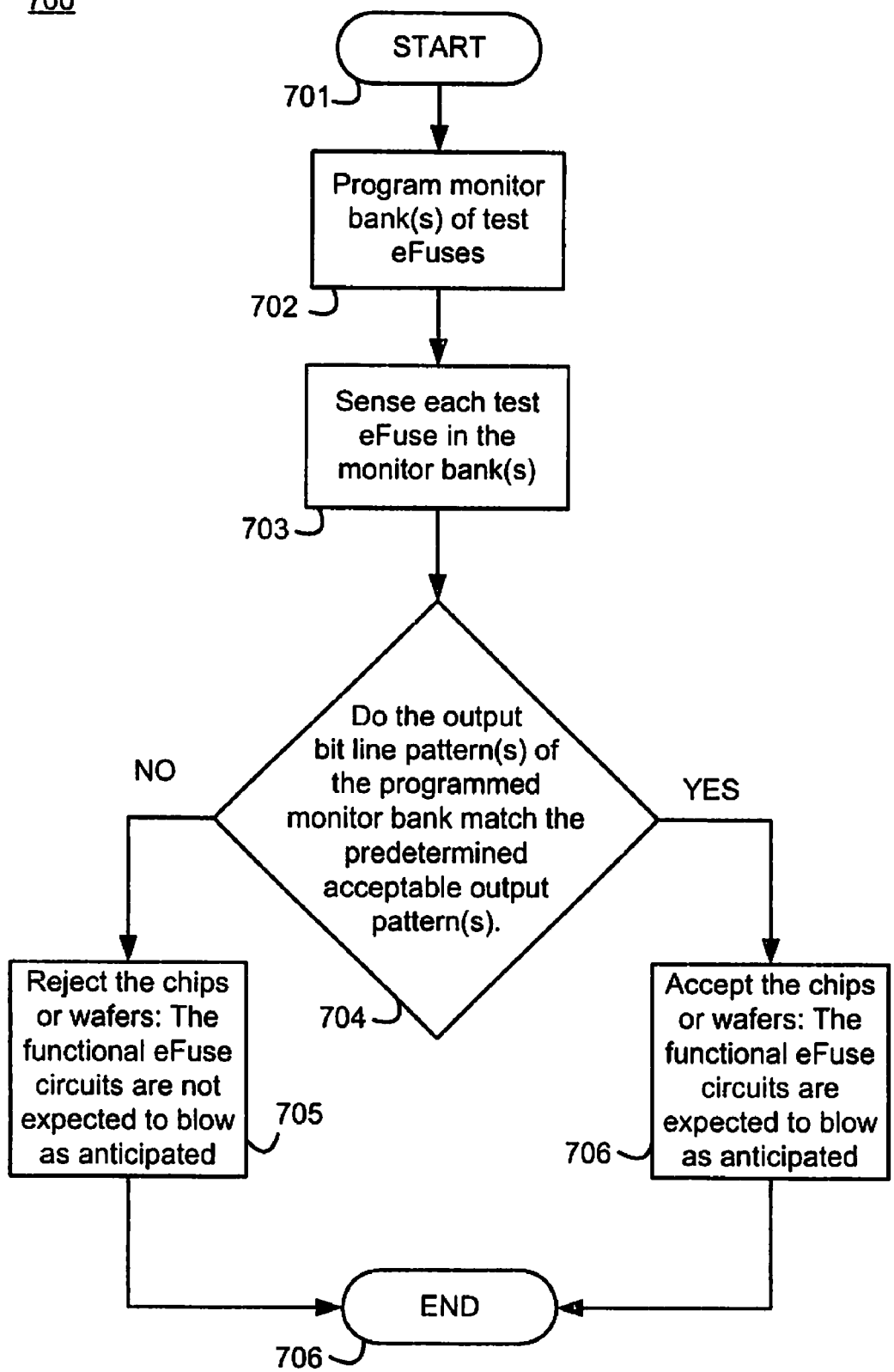
FIG. 11 depicts a method of determining whether functional eFuses will or have blown successfully.

FIG. 11 describes a method to determine whether functional eFuse programming will be or has been successful. Method 700 begins at block 701. Block 702 describes a method step of programming a monitor bank of test eFuses. Block 703 describes a method step of sensing each individual test eFuse circuit in order to determine if the individual test eFuse have or have not blown. Method block 704 is a decision block which determines whether the bit line blow pattern(s) of the programmed monitor bank(s) match the predetermined acceptable output pattern(s). If the patterns match (i.e. YES) the next method step, described in block 706 is to accept the wafer or chip that contains the monitor bank(s) because the functional eFuse circuits contained in the wafer or chip are expected to blow successfully. If the patterns do not match (i.e. NO) the next method step, described in block 705, is to reject the wafer or chip contains the monitor bank because the functional eFuse circuits contained in the wafer or chip are not expected to blow successfully.

Figure 12:
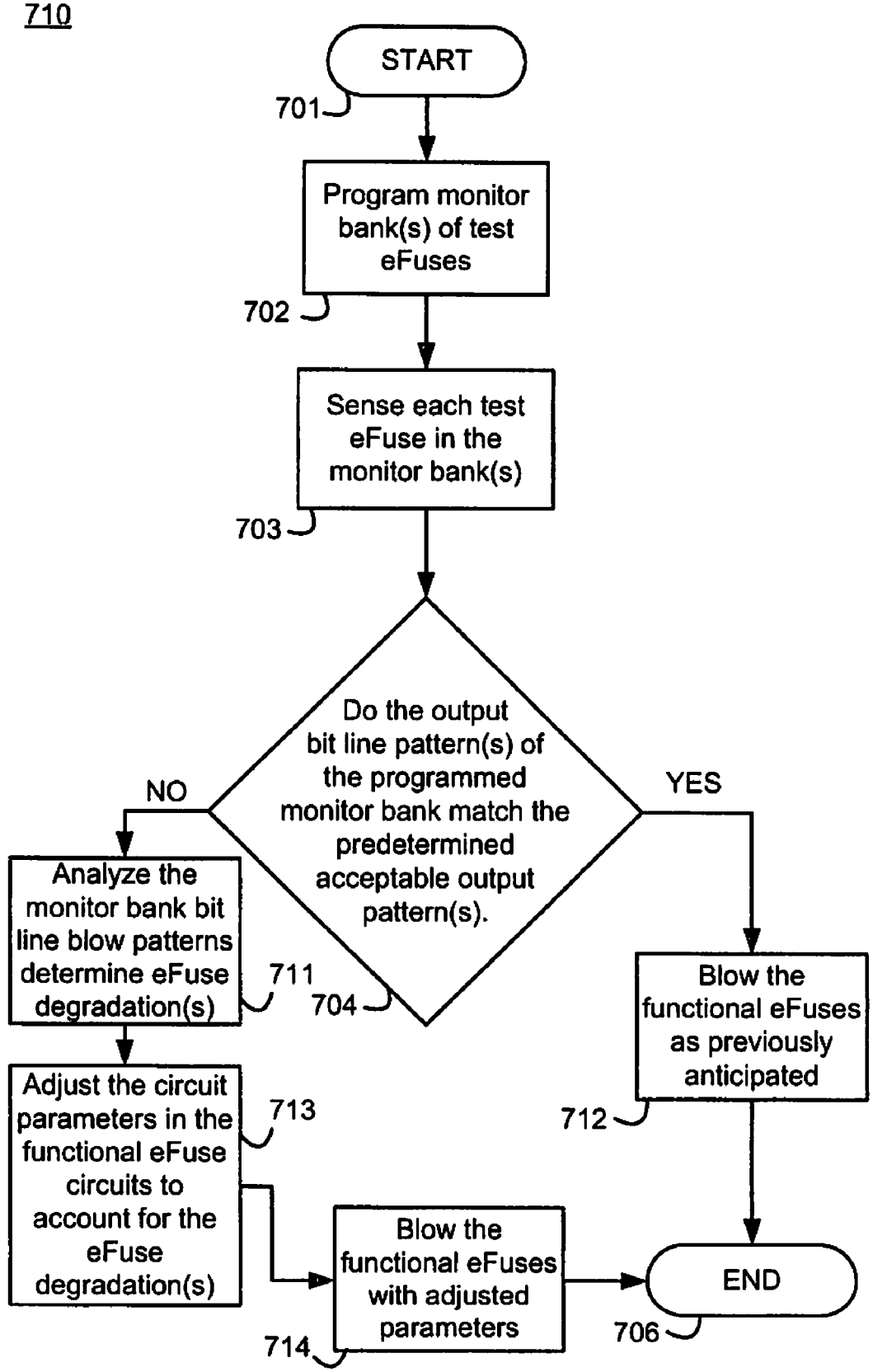
FIG. 12 depicts a method of determining whether to adjust functional eFuse circuit parameters based on a determined eFuse degradation characteristic.

FIG. 12 describes an alternate method to determine whether functional eFuse programming will be or has been successful. Method 710 begins at block 701. Block 702 describes a method step of programming a monitor bank of test eFuses. Block 703 describes a method step of sensing each individual test eFuse circuit in order to determine if the individual test eFuse have or have not blown. Method block 704 is a decision block which determines whether the bit line blow pattern(s) of the programmed monitor bank(s) match the predetermined acceptable output pattern(s). If the patterns match (i.e. YES) the next method step, described in block 712 is to blow the functional eFuses as previously anticipated because the functional eFuses are expected to blow successfully. If the patterns do not match (i.e. NO) the next method step, described in block 711, is to analyze the monitor bank bit line blow patterns to determine eFuse degradations. Block 713 describes a method step of adjusting the circuit parameters in the functional eFuse circuits to account for the determined eFuse degradations. Block 714 describes a method step of blowing the functional eFuses with the adjusted functional eFuse circuit parameters. Method 710 ends at block 706.

The invention claimed is:

1. One or more monitor banks each comprising:
a first set one time programmable memory circuits representing a second set of one time programmable memory circuits, the first set of one time programmable memory circuits being programmed at a separate time instance from the second set of one time programmable memory circuits in order to determine whether the second set of one time programmable memory circuits have or will program successfully, the first set of one time programmable memory circuits further comprising:
a first particular one time programmable memory circuit configured to always be expected to blow when the first set of one time programmable memory circuits is programmed; and
a second particular one time programmable memory circuit configured to never be expected to blow when the first set of one time programmable memory circuits is programmed.

2. The one or more monitor banks of claim 1 wherein the first set of one time programmable memory circuits further comprises:
at least a third particular one time programmable memory circuit configured to be more difficult to blow than the second particular one time programmable memory circuit and easier to blow than the first particular one time programmable memory circuit.

3. The one or more monitor banks of claim 1 wherein the first set of one time programmable memory circuits further comprises:
a plurality of sequentially varying one time programmable memory circuits wherein each successive individual one time programmable memory circuit is configured to be more difficult to blow relative to the previous one time programmable memory circuit in the sequence.

4. The one or more monitor banks of claim 1 wherein the first set of one time programmable memory circuits is a set of test eFuses, the second set of one time programmable memory circuits is a set of functional eFuses, the first particular one time programmable memory circuit is a first test eFuse circuit, the second particular one time programmable memory circuit is a second test eFuse circuit, and the third particular one time programmable memory circuit is a third eFuse circuit.

5. The one or more monitor banks of claim 4 wherein the set of test eFuses further comprises:
a plurality of sequentially varying test eFuse circuits wherein each successive individual eFuse circuit is configured to be more difficult to blow relative to the previous eFuse circuit in the sequence.

6. The one or more monitor banks of claim 5 wherein upon programming the first set of eFuse circuits results in a first group of zero or more unblown eFuse circuits and a second group of zero or more blown eFuse circuits.

7. The one or more monitor banks of claim 5 wherein at least one monitor bank is located in a kerf area of a semiconductor wafer.

8. The one or more monitor banks of claim 5 wherein at least one monitor bank is located on a packaged semiconductor chip and is blown prior to the time the packaged semiconductor chip is placed into commerce.

9. The one or more monitor banks of claim 5 wherein at least one monitor bank is located on a packaged semiconductor chip and is blown subsequent to a determination that the packaged semiconductor chip is defective.

10. The one or more monitor banks of claim 5 wherein the first eFuse circuit is configured such that the amount of current passing through a first eFuse link is expected to always cause the first eFuse link to blow, wherein the second eFuse circuit is configured such that the amount of current passing through a second eFuse link is expected to never cause the second eFuse link to blow, and wherein the plurality of sequentially varying eFuse circuits are configured such that the amount of current passing through each individual eFuse link contained in the plurality of eFuse circuits sequentially increases.

11. The one or more monitor banks of claim 10 wherein the current passing through each eFuse link is controlled by one or more transistors.

12. The one or more monitor banks of claim 11 wherein the increasing amount of current passing though each eFuse link is controlled by decreasing the channel lengths of the one or more transistors.

13. The one or more monitor banks of claim 11 wherein increasing amount of current passing though each eFuse link is controlled by increasing the gate widths of the one or more transistors.

14. A fuse bank having a first set of test one time programmable memory circuits used to verify a second set of functional one time programmable memory circuits, the first set of test one time programmable memory circuits being programmed at a separate time instance from the second set of functional one time programmable memory circuits in order to determine whether the second set of functional one time programmable memory circuits have or will program successfully, the fuse bank comprising:

a first one time programmable memory circuit that always blows when the fuse bank is programmed; and a second one time programmable memory circuit that never blows when the fuse bank is programmed.

15. The fuse bank of claim 14 further comprising:

at least a third one time programmable memory circuit configured to be more difficult to blow than the second one time programmable memory circuit and easier to blow than the first one time programmable memory circuit.

16. The fuse bank of claim 14 further comprising:

a plurality of sequentially varying one time programmable memory circuits wherein each successive individual one time programmable memory circuit is configured to be more difficult to blow relative to the previous one time programmable memory circuit in the sequence.

17. The fuse bank of claim 14 wherein upon programming the fuse bank results in a first group of zero or more unblown one time programmable memory circuits and a second group of zero or more blown one time programmable memory circuits.

18. The fuse bank of claim 14 wherein the fuse bank is located in a kerf area of a semiconductor wafer.

19. The fuse bank of claim 14 wherein the fuse bank is located on a packaged semiconductor chip and is blown prior to the packaged semiconductor chip being placed into commerce.

20. The fuse bank of claim 14 wherein the fuse bank is located on a packaged semiconductor chip and is blown subsequent to a determination that the packaged semiconductor chip is defective.

\* \* \* \* \*